United States Patent
Tseng et al.

(10) Patent No.: US 10,020,049 B1
(45) Date of Patent: Jul. 10, 2018

(54) SIX-TRANSISTOR STATIC RANDOM ACCESS MEMORY CELL AND OPERATION METHOD THEREOF

(71) Applicant: UNITED MICROELECTRONICS CORP., Hsin-Chu (TW)

(72) Inventors: Chun-Yen Tseng, Tainan (TW); Ching-Cheng Lung, Tainan (TW); Yu-Tse Kuo, Tainan (TW); Chun-Hsien Huang, Tainan (TW); Chih-Wei Tsai, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 25 days.

(21) Appl. No.: 15/413,436

(22) Filed: Jan. 24, 2017

(30) Foreign Application Priority Data

Jan. 3, 2017 (TW) .............................. 106100021 A

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC .... G11C 11/412; G11C 7/1069; G11C 7/1096
USPC ....................................................... 365/154
See application file for complete search history.

(56) References Cited

U.S. PATENT DOCUMENTS

| 5,631,863 | A  | * | 5/1997  | Fechner  | G11C 11/4125 257/903 |
| 2009/0285011 | A1 | * | 11/2009 | Pradhan  | G11C 11/412 365/156 |
| 2010/0315862 | A1 | * | 12/2010 | Huang    | G11C 11/419 365/156 |
| 2012/0120717 | A1 | * | 5/2012  | Sekigawa | G11C 11/4125 365/156 |
| 2014/0269022 | A1 | * | 9/2014  | Xie      | G11C 11/412 365/154 |
| 2016/0093365 | A1 | * | 3/2016  | Song     | G11C 11/419 365/154 |

OTHER PUBLICATIONS

Sarfraz, Title of IEEE:Characterization of a Low Leakage Current and High-Speed 7T SRAM Circuit with Wide Voltage Margins, 2013.

* cited by examiner

*Primary Examiner* — Huan Hoang
*Assistant Examiner* — Minh Dinh
(74) *Attorney, Agent, or Firm* — Winston Hsu

(57) ABSTRACT

The present invention provides a six transistor static random-access memory (6T-SRAM) cell, the 6T-SRAM cell includes a first inverter comprising a first pull-up transistor and a first pull-down transistor, and a first storage node, a second inverter comprising a second pull-up transistor, a second pull-down transistor, and a second storage node, wherein the first storage node is coupled to gates of the second pull-up transistor and the second pull-down transistor, a switch transistor configured to couple the second storage node to gates of the first pull-up transistor and the first pull-down transistor, and an access transistor coupled to gates of the first pull-up transistor and the first pull-down transistor.

15 Claims, 7 Drawing Sheets

SIX-TRANSISTOR STATIC RANDOM ACCESS MEMORY CELL AND OPERATION METHOD THEREOF

BACKGROUND OF THE INVENTION

1. Field of the Invention

The present invention relates to a static random access memory (SRAM), and more particularly to a six transistors static random access memory (6T-SRAM) cell with increased stability and increased writing speed.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

Referring to FIG. 1, FIG. 1 illustrates a circuit diagram of a conventional six-transistor SRAM (6T-SRAM) cell. The device includes at least one SRAM cell, each SRAM cell including a six-transistor SRAM (6T-SRAM) cell 10.

Each 6T-SRAM cell 10 is composed of a first pull-up transistor 12, a second pull-up transistor 14, and a first pull-down transistor 16, a second pull-down transistor 18, a first access transistor 20 and a second access transistor 21. These six devices (transistors) constitute a set of flip-flops. The first and the second pull-up transistors 12 and 14, and the first and the second pull-down transistors 16 and 18 constitute a latch circuit 22 that stores data in the storage nodes 24 and 26. Since the first and the second pull-up transistors 12 and 14 act as power load devices, they can be replaced by resistors. Under this circumstance, the static random access memory becomes a four-transistor SRAM (4T-SRAM). In addition, the first and the second pull-up transistors 12 and 14 preferably share a source/drain region and electrically connect to a voltage source (voltage node) Vcc, and the first and the second pull-down transistors 16 and 18 share a source/drain region and electrically connect to a voltage source (voltage node) Vss.

Preferably, the first and the second pull-up transistors 12 and 14 of the 6T-SRAM cell 10 are composed of p-type metal oxide semiconductor (PMOS) transistors, and the first and the second pull-down transistors 16 and 18, the first access transistors 20 and the second access transistors 21 are composed of n-type metal oxide semiconductor (NMOS) transistors. The first pull-up transistor 12 and the first pull-down transistor 16 constitute an inverter, which further form a series circuit 28. One end of the series circuit 28 is connected to a voltage source Vcc and the other end of the series circuit 28 is connected to a voltage source Vss. Similarly, the second pull-up transistor 14 and the second pull-down transistor 18 constitute another inverter and a series circuit 30. One end of the series circuit 30 is connected to the voltage source Vcc and the other end of the series circuit 30 is connected to the voltage source Vss. The two inverters are cross-coupled to each other to store data.

The storage node 24 is connected to the respective gates of the second pull-down transistor 18 and the second pull-up transistor 14. The storage node 24 is also connected to the drains of the first pull-down transistor 16, the first pull-up transistor 12 and the first access transistor 20. Similarly, the storage node 26 is connected to the respective gates of the first pull-down transistor 16 and first the pull-up transistor 12. The storage node 26 is also connected to the drains of the second pull-down transistor 18, the second pull-up transistor 14 and the second access transistor 21. The gates of the first access transistor 20 and the second access transistor 21 are respectively coupled to one word line 32; the sources of the first access transistor 20 and the second access transistor 21 are respectively coupled to a first bit line 34 and a second bit line 36.

SUMMARY OF THE INVENTION

The present invention provides a six transistor static random-access memory (6T SRAM) cell. The 6T SRAM cell comprises a first inverter comprising a first pull-up transistor and a first pull-down transistor, and a first storage node, a second inverter comprising a second pull-up transistor, a second pull-down transistor, and a second storage node, wherein the first storage node is coupled to gates of the second pull-up transistor and the second pull-down transistor, a switch transistor configured to couple the second storage node to gates of the first pull-up transistor and the first pull-down transistor, and an access transistor coupled to gates of the first pull-up transistor and the first pull-down transistor.

The present invention further provides method of operating a six transistor static random access memory (6T SRAM) cell, the method comprising: first, a six transistor static random-access memory (6T SRAM) cell is provided, and the 6T SRAM cell comprises a first inverter comprising a first pull-up transistor and a first pull-down transistor, and a first storage node, a second inverter comprising a second pull-up transistor, a second pull-down transistor, and a second storage node, wherein the first storage node is coupled to gates of the second pull-up transistor and the second pull-down transistor, a switch transistor configured to couple the second storage node to gates of the first pull-up transistor and the first pull-down transistor, and an access transistor coupled to gates of the first pull-up transistor and the first pull-down transistor. Next, the switch transistor is deactivated during a write operation, a data value is written in the second storage node through the access transistor, and the switch transistor is activated after the data value is written in the second storage.

In summary, the key feature of the present invention is that one 6T-SRAM only comprises one single access transistor and one single switch, and the two transistors are connected to an independent word line and mode line respectively. By turning on or turning off the switch transistor, this will maintain or cut the latch state of the 6T-SRAM cell. When the 6T-SRAM cell is in the latch state, it has higher stability, and when the latching state of the 6T-SRAM cell is cut off, values can be easily written to the 6T-SRAM cell. Therefore, depending on the requirement to turning on or turning off the switch transistor, it can improve the overall stability and writing speed of the SRAM memory.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
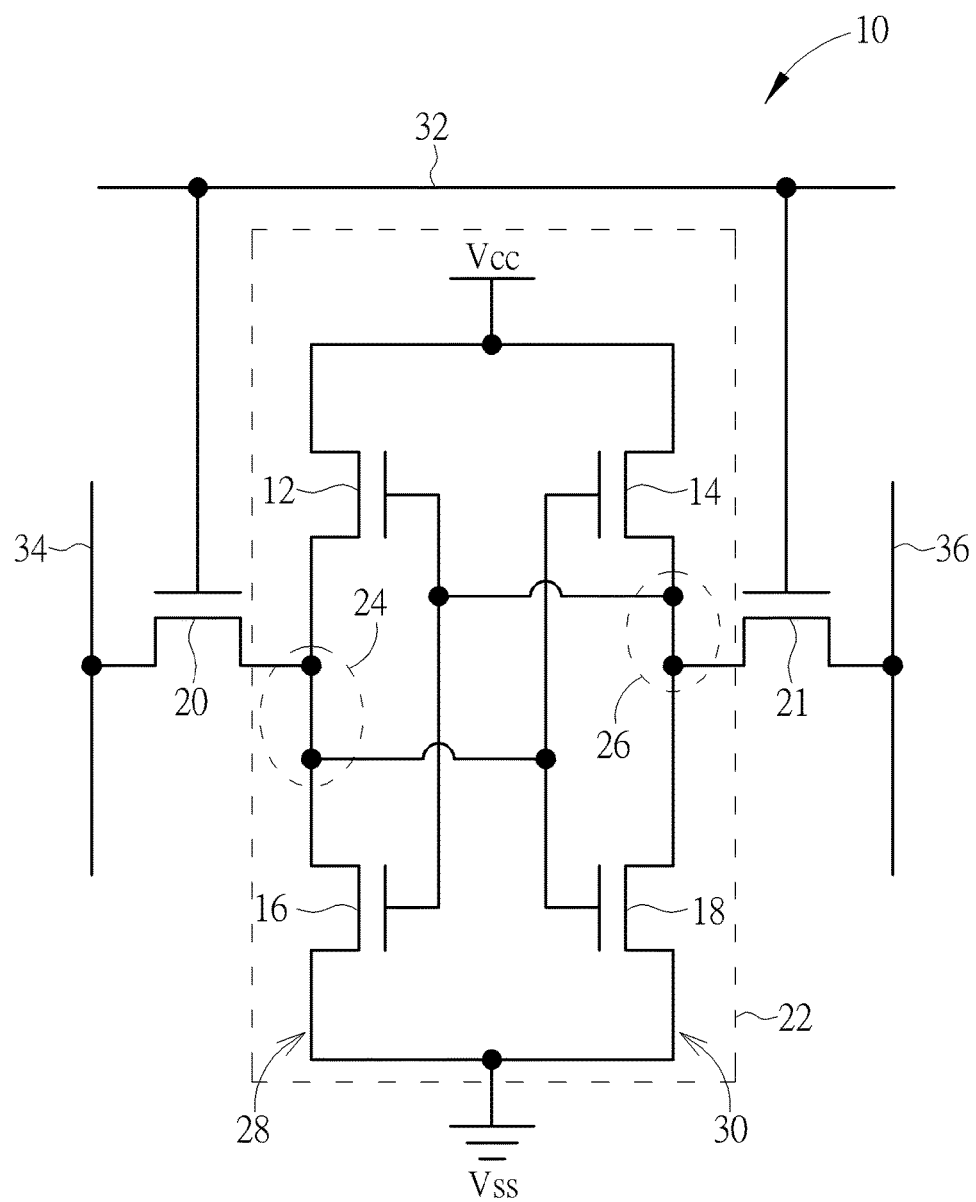
FIG. 1 illustrates a circuit diagram of a conventional six-transistor SRAM (6T-SRAM) cell.
Figure 2:
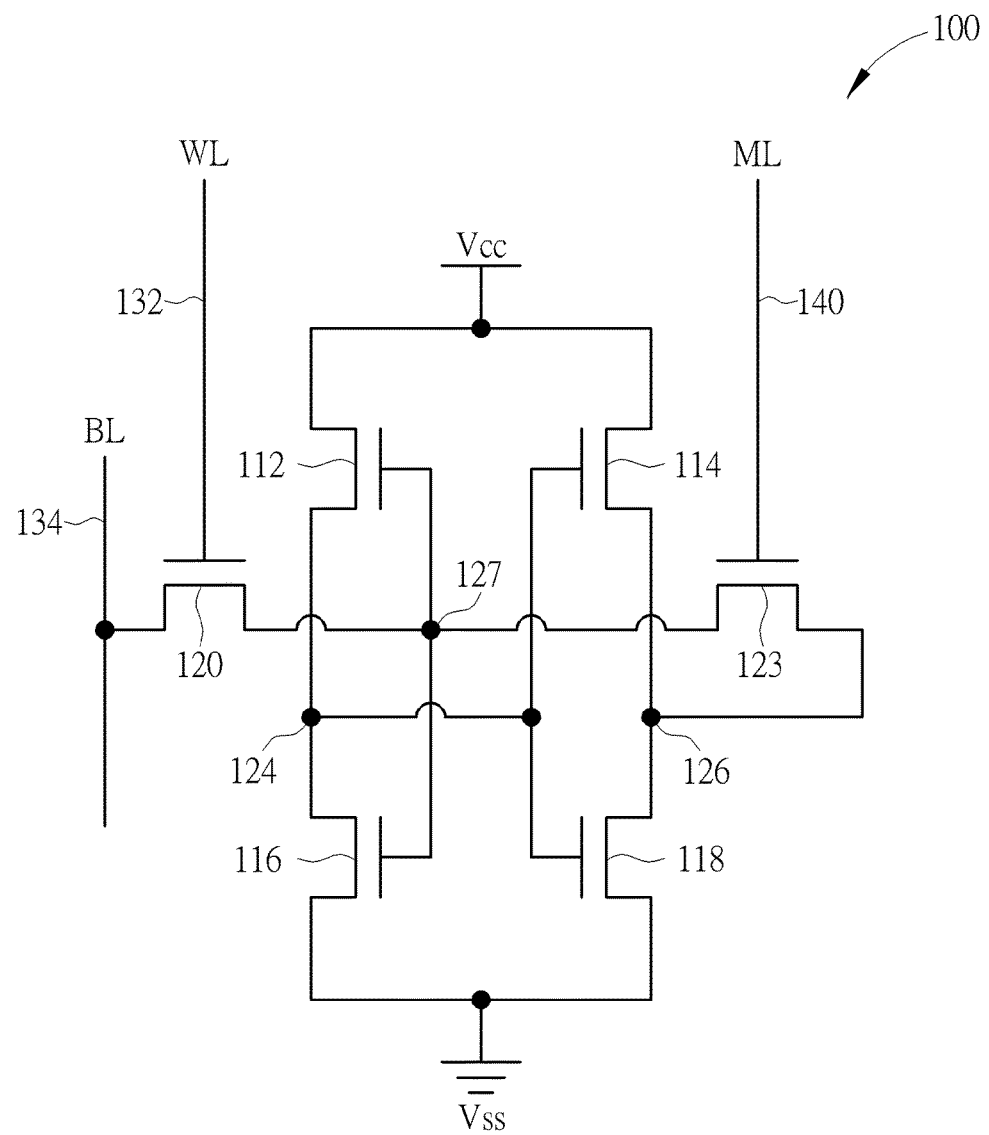
FIG. 2 generally illustrates a schematic of a six transistor cell according to the first preferred embodiment of the present invention.

FIG. 2 generally illustrates a schematic of a memory cell (such as a six transistor cell) 100 according to the first preferred embodiment of the present invention. For example, one memory device may comprise a plurality of 6T-SRAM cells 100 arranged in matrix. Each 6T-SRAM cell 100 comprises a first inverter comprising a first storage node 124 lying between a first pull-up (such as a PMOS) transistor 112 and a first pull-down (such as a NMOS) transistor 116, and a second inverter comprising a second storage node 126 lying between a second pull-up (such as a PMOS) transistor 114 and a second pull-down (such as a NMOS) transistor 118. A gate of an access transistor 120 (such as a NMOS) coupled to a word line (WL) 132. Therefore, the access transistor 120 can be activated (turned "on") or deactivated (turned "off") through the word line 132. A source of the access transistor 120 coupled to a bit line 134, and a drain of the access transistor 120 coupled to gates of the first pull-up transistor 112 and the first pull-down transistor 116, as shown in node 127 of FIG. 2. Besides, the sources of the first pull-up transistor 112 and the second pull-up transistor 114 are connected to a voltage source Vcc, and the drains of the first pull-down transistor 116 and the second pull-down transistor 118 are connected to a voltage source Vss (or ground).

In the 6T-SRAM cell 100, the gates of the second pull-up transistor 114 and the second pull-down transistor 118 are coupled to one another, and electrically connected to the first storage node 124. The gates of the first pull-up transistor 112 and the first pull-down transistor 116 are coupled to one another, but not directly coupled to second storage node 126. Instead, a switch transistor 123 is electrically connected to the gates the first pull-up transistor 112 and the first pull-down transistor 116, and also electrically connected to the second storage node 126. In other words, the node 127 is coupled to the second storage node 126 via the switch transistor 123. For the switch transistor 123 such as an NMOS, the gate of the switch transistor 123 is coupled to a mode line (ML) 140, and the mode line transfers independent signals from a controller (not shown) to control the switch transistor 123. Therefore, the switch transistor 123 can be independently activated (turned "on") or deactivated (turned "off").

More precisely, in the 6T-SRAM cell 100 of the present invention, by transferring different signals (logical "0" or "1") via the word line 132, the bit line 134 and the mode line 140, the access transistor 120 and the switch transistor 123 can be independently activated or deactivated. Generally, the 6T-SRAM cell 100 comprises a standby mode, a reading mode and a writing mode.

Figure 3:
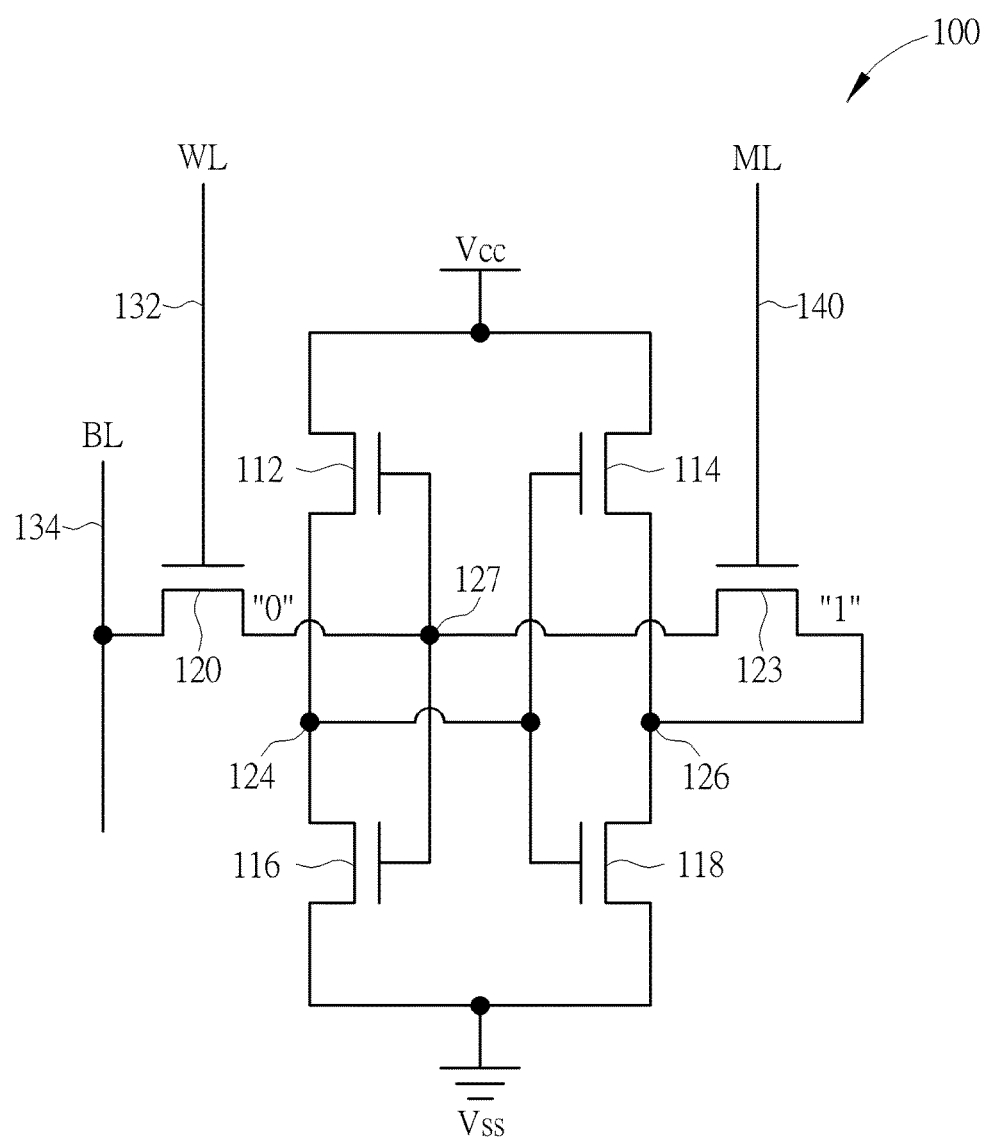
FIG. 3 generally illustrates the 6T-SRAM cell of the present invention in a standby mode.

Firstly, please refer to FIG. 3. FIG. 3 generally illustrates the 6T-SRAM cell of the present invention 100 in a standby mode. In the standby mode, the word line 132 is set to "0" (it means the word line 132 transfers logical 0 signal to the switch transistor 123), and the mode line 140 is set to "1" (it means the mode line 140 transfers logical 1 signal to the switch transistor 123). Therefore, the access transistor 120 is in an "off" configuration, but the switch transistor 123 is in an "on" configuration. As a result, the current can flow freely between first storage node 124 and the second storage node 126. Furthermore, in the standby mode, the operation of the 6T-SRAM cell of the present invention is similar to the operation of conventional 6T SRAM cell 100. In particular, the two inverters are cross-coupled to each other. The first storage node 124 couples to the gates of the second pull-up transistor 114 and the second pull-down transistor 118, and the second storage node 126 couples to the gates of the first pull-up transistor 112 and the first pull-down transistor 116, to ensure that the data stored at first storage node 124 and second storage node 126 is maintained. Compared with a conventional 6T-SRAM cell, the 6T-SRAM cell 100 only includes a single bit line 134. Therefore, the amount of bit line leakage is reduced, and less power is consumed during the standby mode.

Figure 4:
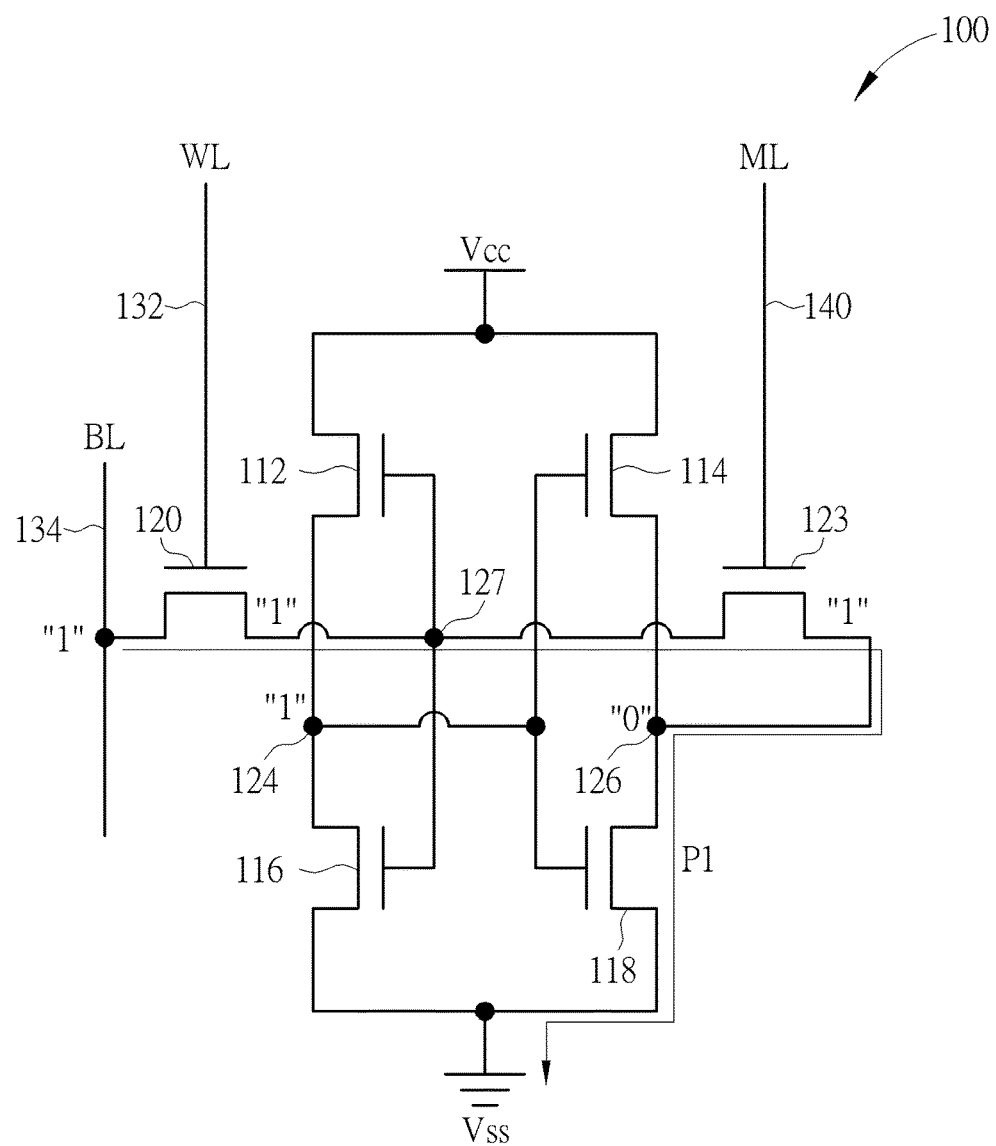
FIG. 4 generally illustrates the 6T-SRAM cell of the present invention in a reading mode.

Next, please refer to FIG. 4. FIG. 4 generally illustrates the 6T-SRAM cell of the present invention 100 in a reading mode. In the standby mode, the word line 132 is set to "1" (it means the word line 132 transfers logical 1 signal to the switch transistor 123), the mode line 140 is set to "1" (it means the mode line 140 transfers logical 1 signal to the switch transistor 123), in addition, the bit line 134 is pre-charged (it can be deemed as logical 1). Therefore, the access transistor 120 is in an "on" configuration, and the switch transistor 123 is also in an "on" configuration. Take the second storage node 126 storing a logical 0 value as an example, since the electric potential at the second storage node 126 is lower than the electric potential at the bit line 134, the current will flow along the path P1, from the bit line 134, passing through the access transistor 120, the switch transistor 123, and the second pull-down transistor 118 to the voltage source Vss (or grounded). Therefore, if the detected voltage value of the bit line 134 is lower than a predetermined value in a period, that means the second storage node 126 stores logical "0". Otherwise, the second storage node 126 stores logical "1". Using the method mentioned above, it is possible to determine the value stored in the 6T-SRAM cell 100.

In the reading mode mentioned above, since the switch transistor 123 is in the "on" configuration, so the 6T-SRAM cell 100 is in a latch configuration, the two inverters are cross-coupled to each other. In this state, the 6T-SRAM cell 100 has high stability and is less susceptible to changing the data stored in the 6T-SRAM cell 100 due to the influence of the external voltage.

Figure 5:
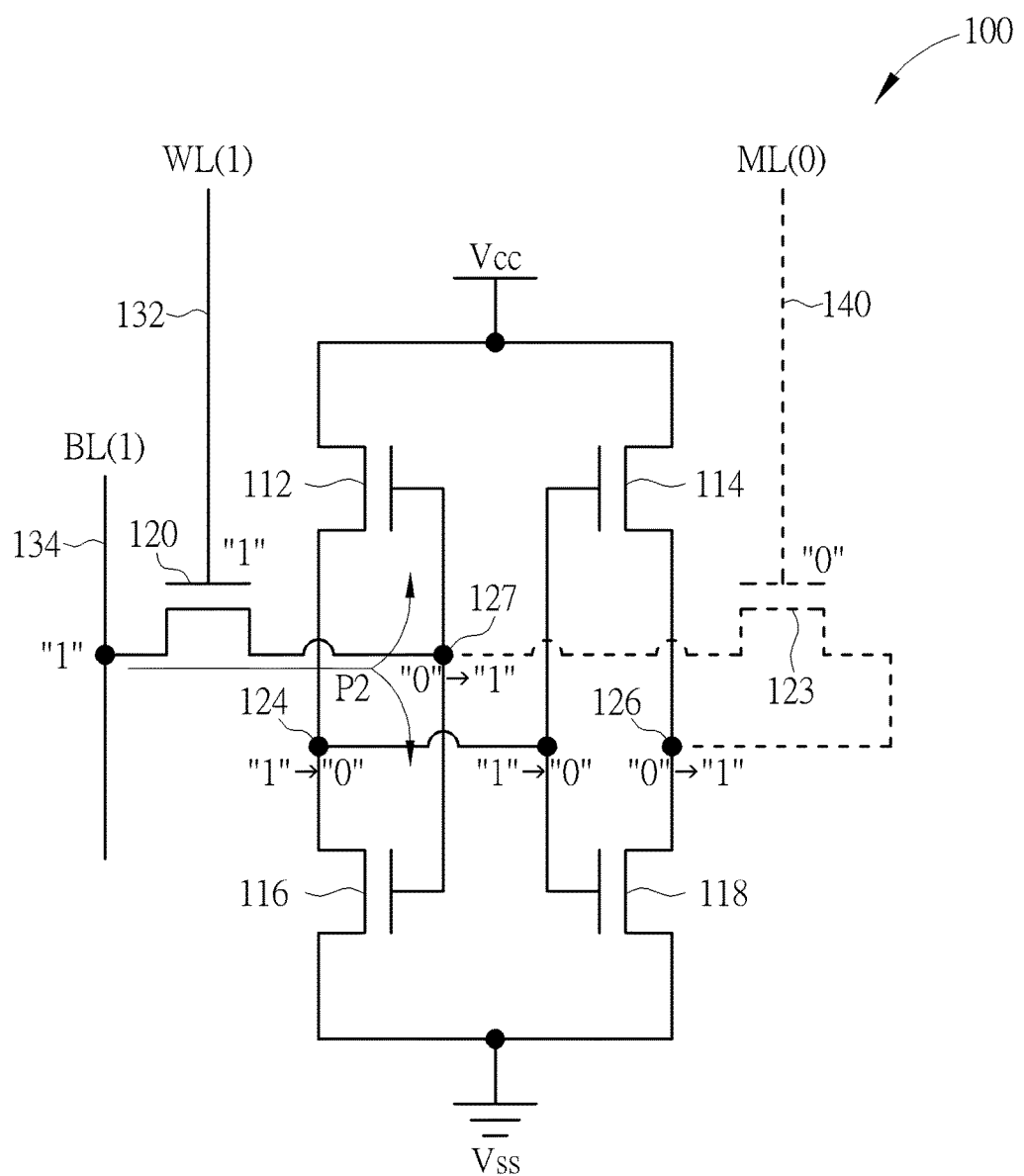
FIG. 5 generally illustrates the 6T-SRAM cell of the present invention in a writing mode.

Please refer to FIG. 5. FIG. 5 generally illustrates the 6T-SRAM cell of the present invention 100 in a writing mode. In the standby mode, the word line 132 is set to "1" (it means the word line 132 transfers logical 1 signal to the switch transistor 123), and the mode line 140 is set to "0" (it means the mode line 140 transfers logical 0 signal to the switch transistor 123). In addition, the potential of the bit line 134 is changed depending on the value to be written. For example, when the value to be written to the second storage node 126 is 1, the bit line 134 is pre-charged to a high potential (which may be deemed as logical 1). Therefore, in the writing mode, the access transistor 120 is in an "on" configuration, but the switch transistor 123 is in an "off" configuration. As shown in FIG. 5, since the switch transistor 123 is deactivated, the path from the node 127 to the second storage node 126 is cut, and FIG. 5 shows the cut path in dashed lines. The current (which is regarded as a logical signal 1) will pass from the bit line 134 along the path P2, after accessing the transistor 120, to the gate of the first pull-up transistor 112 and the first pull-down transistor 116 respectively, so as to deactivate the first pull-up transistor 112, and to activate the first pull-down transistor 116, so that the first storage node 124 and the voltage source Vss are equipotential (or grounded). In other words, the value stored in the first storage node 124 will become logical 0. Since the values stored in the first storage node 124 and in the second storage node 126 are necessarily complementary, the value stored in the second storage node 126 will become logical 1 to reach the purpose of writing the logical value 1 to the second storage node 126.

It is noteworthy that during the writing mode, since the switch transistor 123 is temporarily deactivated, so the 6T-SRAM cell 100 is not in the latched state. In this state, the external value will be easily written and stored in the storage node, but the stored value in the first storage node 124 or in the second storage node 126 cannot be stably maintained. Therefore, a complete writing step of the 6T-SRAM cell 100 of the present invention comprises: (1) switching to the writing mode, and the value is stored in the second storage node 126, and (2) performing a saving step, switching back to the standby mode again. In other words, activating the switching transistor 123, and then the access transistor 120 is deactivated to return the latch state of the 6T-SRAM cell 100, and stably store the written value.

Figure 6:
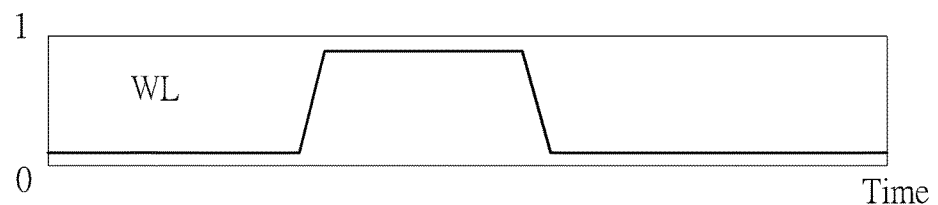
FIG. 6 depicts a timing diagram of the 6T-SRAM cell according to the present invention in a writing step.
Figure 6:
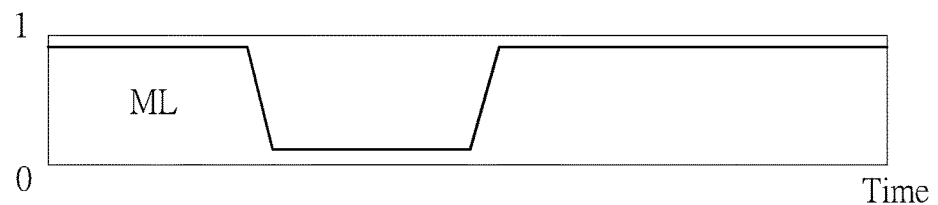

Please refer to FIG. 6, which depicts a timing diagram of the 6T-SRAM cell according to the present invention in a writing step. In particular, the changing of the logical value of the bit line (BL) and the mode line (ML) are shown. The horizontal axis represents time and the vertical axis represents the logic potential variation of the bit line (BL) and the mode line (ML). As shown in FIG. 6 and also referring FIGS. 3-5 mentioned above, during a writing step, the logical value of the mode line ML is decreased to 0, it means the switch transistor 123 will be turned off to enter the writing mode, and the 6T-SRAM cell 100 will temporarily not be latched. Next, the logical value of the word line WL is increased from 0 to 1, it represents the access transistor 120 is turned on, and the value is written in the 6T-SRAM cell 100. After the value is written in the 6T-SRAM cell 100, a saving step should be performed. More precisely, the logical value of the mode line ML is increased to 1, and the logical value of the word line WL is then decreased to 0, so as to turn off the access transistor 120, and makes the 6T-SRAM cell 100 return to the latch state. In summary, in a writing step, the turning off/turning on step of the mode line ML will be before the turning off/turning on step of the word line.

It is noteworthy that the 6T-SRAM cell of the present invention only comprises 6 transistors, including the first pull-up transistor, the first pull-down transistor, the second pull-up transistor, the second pull-down transistor, the access transistor and the switch transistor mentioned above. The access transistor and the switch transistor can be independently activated or deactivated by the word line and the mode line. In other words, the present invention may comprise a plurality of SRAM cells, but each 6T-SRAM cell does not include more than 6 transistors.

Figure 7:
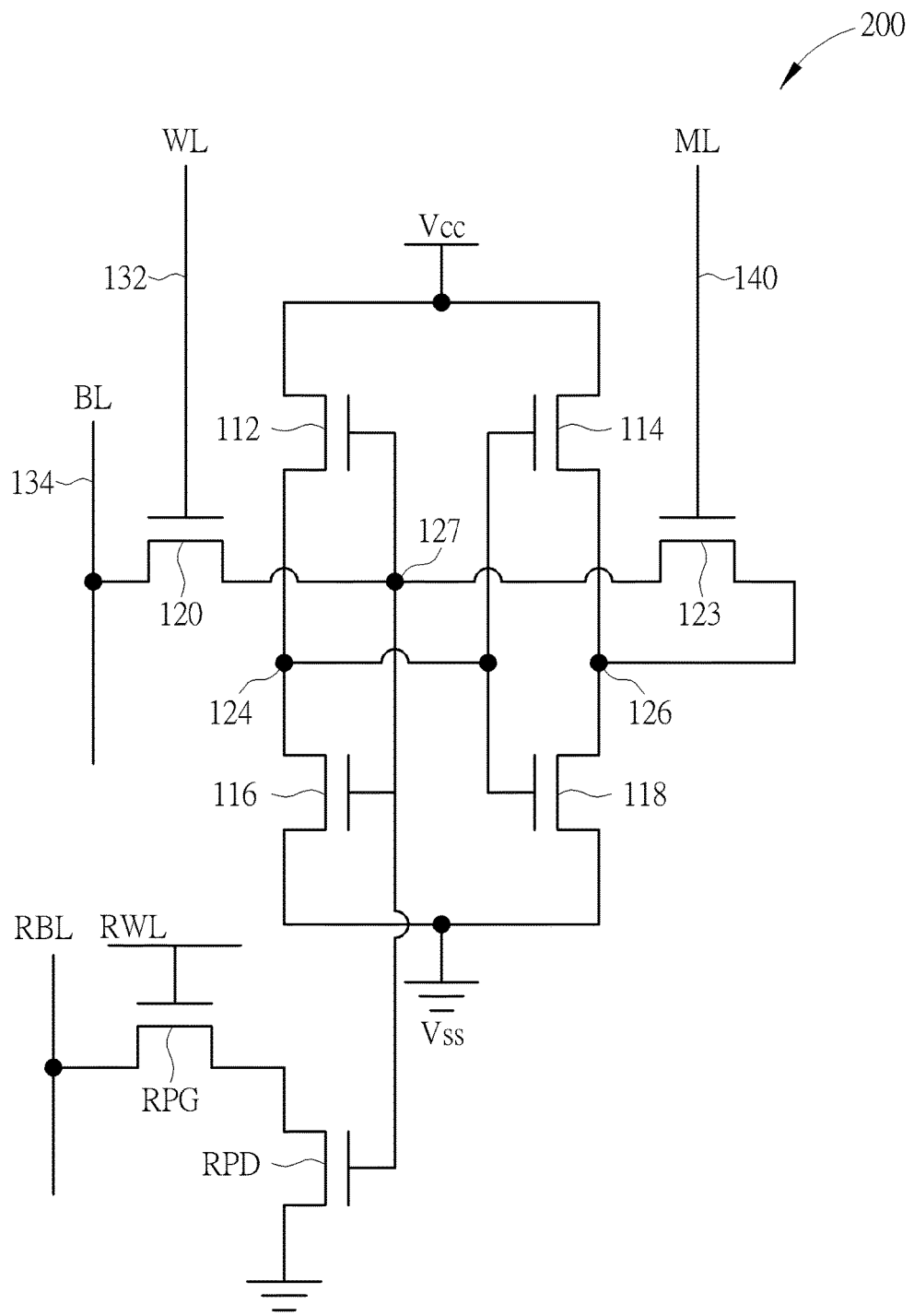
FIG. 7 illustrates the schematic diagram of the 6T-SRAM cell of the present invention additional connects two transistors, so as to form an 8-transistor register file SRAM (8TRF-SRAM).

However, with the main structure of the 6T-SRAM cell of the present invention, it is possible to additionally connect other transistors to increase the reading speed. For example, please refer to FIG. 7, which illustrates the schematic diagram of the 6T-SRAM cell of the present invention additional connects two transistors, so as to form an 8-transistor register file SRAM (8TRF-SRAM). As shown in FIG. 7, an 8TRF-SRAM 200 comprises all elements mentioned in the 6T-SRAM cell 100, and further comprises two read transistors RPG and RPD connected in series with each other. The gate of the read transistor RPG is electrically connected to a read word line RWL, the source of the read transistor RPG is electrically connected to a read bit line RBL, the gate of the read transistor RPD is electrically connected to the latch circuit of the 6T-SRAM cell 100, and the drain of the read transistor RPD is electrically connected to the voltage Vss or grounded.

In this embodiment, the 6T-SRAM cell (please refer to FIG. 2) is used as the main structure, and two transistors are additionally connected to the 6T-SRAM cell, to become the 8TRF-SRAM cell 200. Therefore, the reading speed of the SRAM can be further increased. Even though this embodiment includes eight transistors, the 6T-SRAM cell still includes only six transistors, and only one access transistor and one switch transistor are included in the 6T-SRAM cell, so this embodiment still be within the scope of the present invention. Of course, in other embodiments, more transistors can be connected to the 6T-SRAM, for example, four transistors are additionally connected to the 6T-SRAM cell, to become the 10TRF-SRAM cell, or to form others SRAM devices, and this should also be within the scope of the present invention.

In summary, the key feature of the present invention is that one 6T-SRAM only comprises one single access transistor and one single switch, and the two transistors are connected to an independent word line and mode line respectively. By turning on or turning off the switch transistor, this will maintain or cut the latch state of the 6T-SRAM cell. When the 6T-SRAM cell is in the latch state, it has higher stability, and when the latching state of the 6T-SRAM cell is cut off, values can be easily written to the 6T-SRAM cell. Therefore, depending on the requirement to turning on or turning off the switch transistor, it can improve the overall stability and writing speed of the SRAM memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A six transistor static random-access memory (6T SRAM) cell comprising:

a first inverter comprising a first pull-up transistor and a first pull-down transistor, and a first storage node;

a second inverter comprising a second pull-up transistor, a second pull-down transistor, and a second storage node, wherein the first storage node is coupled to gates of the second pull-up transistor and the second pull-down transistor;

a switch transistor configured to couple the second storage node to gates of the first pull-up transistor and the first pull-down transistor, wherein the switch transistor is configured to be deactivated in a writing mode; and an access transistor coupled to gates of the first pull-up transistor and the first pull-down transistor, wherein the 6T SRAM cell comprises only 6 transistors, and a gate of the switch transistor is not coupled to a gate of the access transistor.

2. The 6T SRAM cell of claim 1, wherein the switch transistor comprises an NMOS transistor.

3. The 6T SRAM cell of claim 1, wherein the switch transistor is configured to be activated in a standby mode and a reading mode.

4. The 6T SRAM cell of claim 1, wherein the gate of the switch transistor is coupled to a mode line.

5. The 6T SRAM cell of claim 1, wherein the gate of the access transistor is coupled to a word line.

6. The 6T SRAM cell of claim 1, wherein the access transistor is configured to couple a bit line.

7. The 6T SRAM cell of claim 1, wherein the gates of the first pull-up transistor and the first pull-down transistor are coupled to each other.

8. The 6T SRAM cell of claim 1, further comprising two read transistors electrically connected to the 6T SRAM cell.

9. A method of operating a six transistor static random access memory (6T SRAM) cell, the method comprising:

providing a six transistor static random-access memory (6T SRAM) cell comprising:

a first inverter comprising a first pull-up transistor and a first pull-down transistor and a first storage node;

a second inverter comprising a second pull-up transistor, a second pull-down transistor and a second storage node, wherein the first storage node is coupled to gates of the second pull-up transistor and the second pull-down transistor;

a switch transistor configured to couple the second storage node to gates of the first pull-up transistor and the first pull-down transistor, wherein the switch transistor is configured to be deactivated in a writing mode; and an access transistor coupled to gates of the first pull-up transistor and the first pull-down transistor, wherein the 6T SRAM cell comprises only 6 transistors, and a gate of the switch transistor is not coupled to a gate of the access transistor;

deactivating the switch transistor during a write operation;

writing a data value in the second storage node through the access transistor; and activating the switch transistor after the data value is written in the second storage.

10. The method of claim 9, wherein the switch transistor comprises an NMOS transistor.

11. The method of claim 9, wherein the gate of the switch transistor is coupled to a mode line.

12. The method of claim 11, wherein the gate of the access transistor is coupled to a word line.

13. The method of claim 11, wherein the mode line is deactivated before the word line is activated during the write operation.

14. The method of claim 13, further comprising performing a standby operation after the writing operation is performed, and wherein the mode line is activated before the word line is deactivated during the standby operation.

15. The method of claim 9, further comprising providing two read transistors electrically connected to the 6T SRAM cell.

* * * * *